(12) United States Patent
Yamada

(10) Patent No.: US 10,381,062 B2
(45) Date of Patent: Aug. 13, 2019

(54) NON-VOLATILE SEMICONDUCTOR STORAGE DEVICE

(71) Applicant: LAPIS Semiconductor Co., Ltd., Yokohama (JP)

(72) Inventor: Takashi Yamada, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 16/266,642

(22) Filed: Feb. 4, 2019

(65) Prior Publication Data

US 2019/0180808 A1 Jun. 13, 2019

Related U.S. Application Data

(63) Continuation of application No. 15/961,305, filed on Apr. 24, 2018, now Pat. No. 10,217,502.

(30) Foreign Application Priority Data

Apr. 27, 2017 (JP) .................................. 2017-087934

(51) Int. Cl.
*G11C 11/22* (2006.01)

(52) U.S. Cl.
CPC ........ *G11C 11/2273* (2013.01); *G11C 11/221* (2013.01)

(58) Field of Classification Search
CPC ..... G11C 11/22; G11C 11/221; G11C 11/223; G11C 11/225; G11C 11/2253; G11C 11/2255; G11C 11/2257; G11C 11/2259; G11C 11/2273; G11C 11/2275; G11C 11/2277; G11C 11/2293; G11C 11/2295; G11C 11/2297

See application file for complete search history.

(56) References Cited

U.S. PATENT DOCUMENTS

| | | | |
|---|---|---|---|
| 6,288,950 B1 | 9/2001 | Koike | |
| 6,370,060 B2 * | 4/2002 | Takata | ..................... G11C 7/14 365/185.2 |
| 6,493,251 B2 | 12/2002 | Hoya et al. | |

(Continued)

FOREIGN PATENT DOCUMENTS

| | | |
|---|---|---|
| JP | H11-191295 A | 7/1999 |
| JP | 2014-207032 A | 10/2014 |

*Primary Examiner* — Harry W Byrne
*Assistant Examiner* — R Lance Reidlinger
(74) *Attorney, Agent, or Firm* — Rabin & Berdo, P.C.

(57) ABSTRACT

A non-volatile semiconductor storage device including a first potential retention line configured to retain a potential corresponding to data read from the memory cell, a second potential retention line configured to retain a reference potential read from the memory cell in which the reference potential is written after the data is read out, a sense amplifier configured to amplify a difference between the potential retained by the first potential retention line and the reference potential for reading out the data from the memory cell, a first offset adjustment circuit connected to the first potential retention line, for adjusting an offset for the potential, a second offset adjustment circuit connected to the second potential retention line, and an offset command signal supply circuit configured to supply a first offset command signal to the first offset adjustment circuit so as to control the offset.

6 Claims, 8 Drawing Sheets

(56) References Cited

U.S. PATENT DOCUMENTS

| | | | | |
|---|---|---|---|---|
| 6,885,597 B2* | 4/2005 | Roehr | ............... | G11C 29/50 |
| | | | | 365/149 |
| 2011/0116296 A1* | 5/2011 | Kitagawa | ............ | G11C 11/5678 |
| | | | | 365/51 |

* cited by examiner

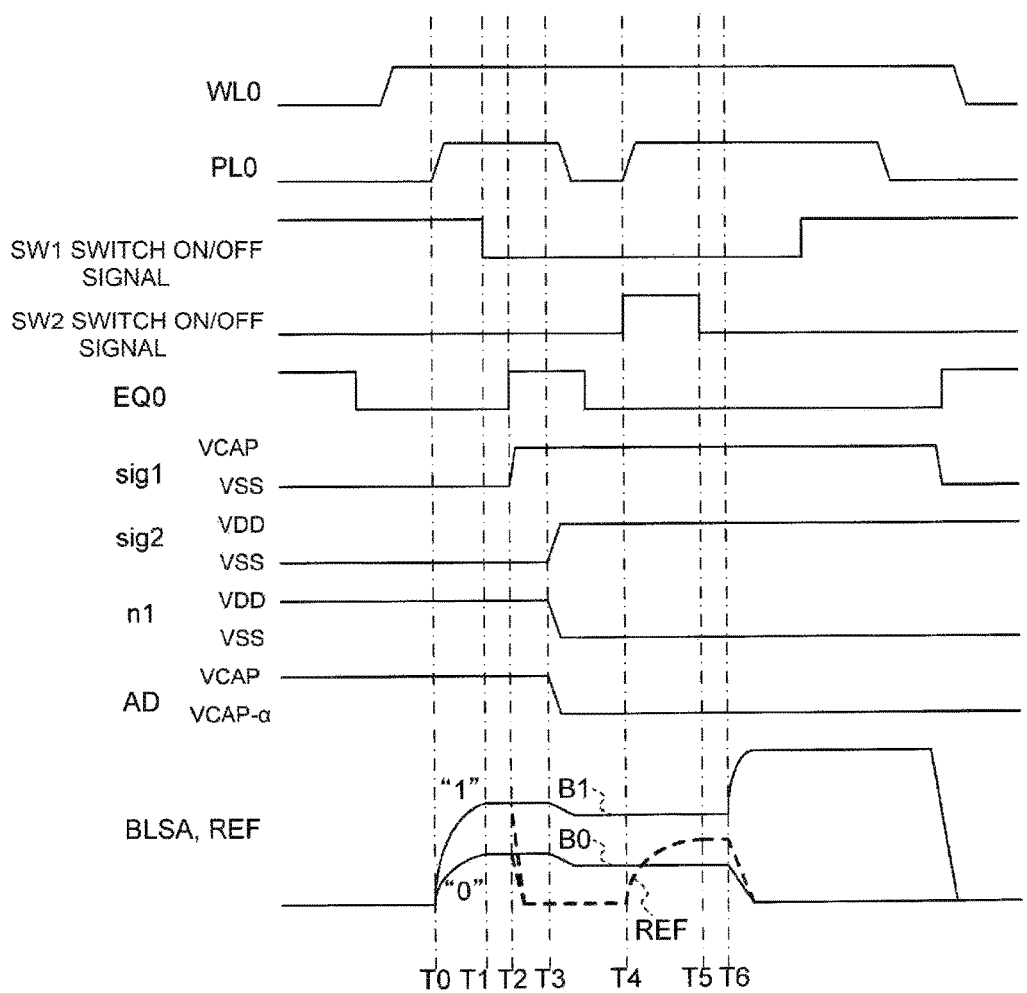

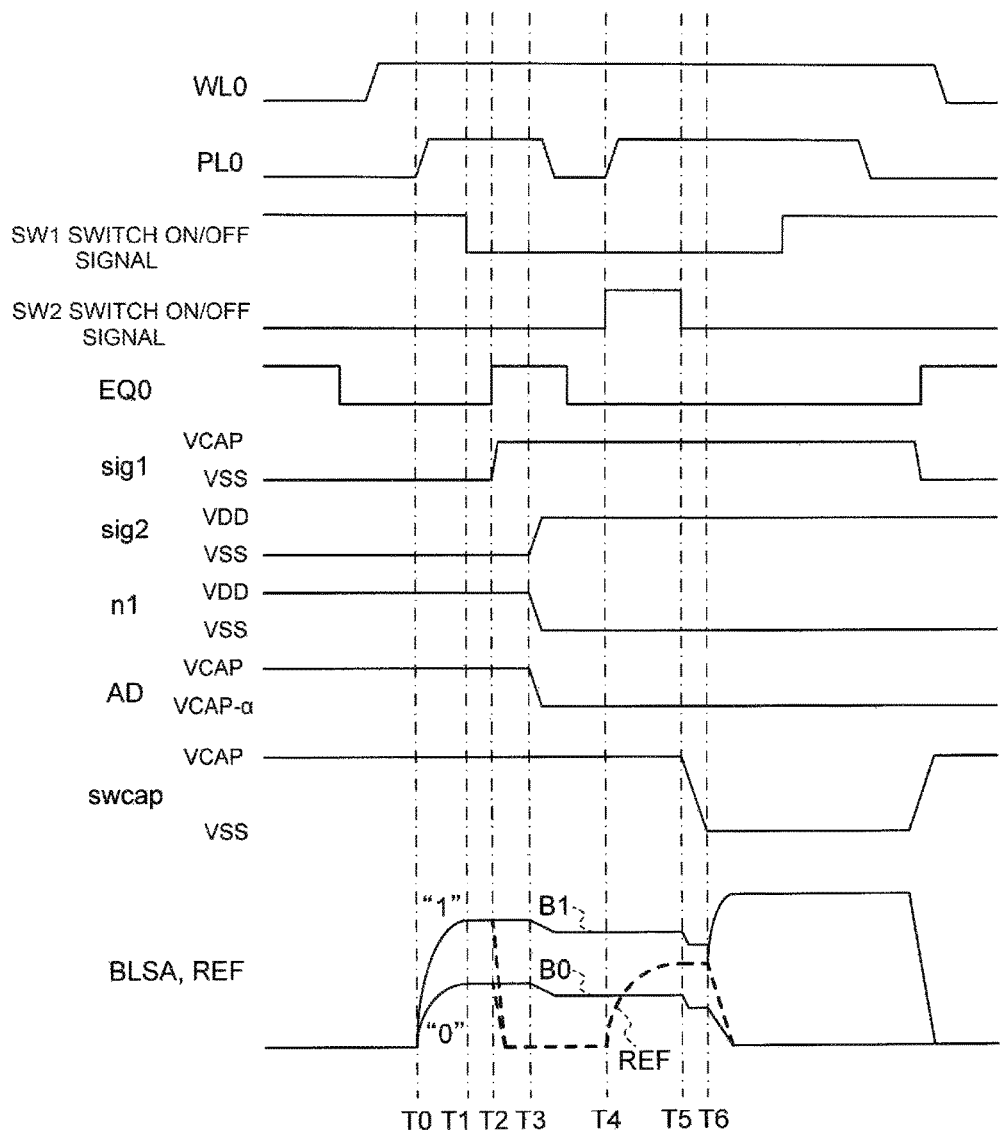

NON-VOLATILE SEMICONDUCTOR STORAGE DEVICE

CROSS REFERENCE TO RELATED APPLICATIONS

This application is a continuation of U.S. application Ser. No. 15/961,305, filed on Apr. 24, 2018, and allowed on Oct. 17, 2018, which is based upon and claims the benefit of priority from Japanese Patent Application No. 2017-087934, filed on Apr. 27, 2017. The entire disclosures of these prior U.S. and foreign applications are incorporated herein by reference.

BACKGROUND OF THE INVENTION

The present invention relates to a non-volatile semiconductor storage device that reads and writes data using memory cells.

In a non-volatile semiconductor memory using memory cells, when performing 1T1C data-reading, a reference potential is generated in order to determine whether the logical value of the read data is "0" or "1". Known methods for generating a reference potential include a method using dummy cells, and a method (self-referential method) using the very memory cells from which data is being read (reading cells). In the method using dummy cells, there is a risk that due to differences in access frequency of dummy cells and reading cells or the like, characteristics of the cells deviate from each other over time, resulting in a decrease in accuracy in determining the read data value. By contrast, when generating a reference potential by the self-referential method, the reference potential is generated using the reading cells themselves, and thus, even if there are variances in manufacturing and changes over time, it is possible to maintain a high degree of accuracy in determining the data value of the read data.

When reading data by the self-referential method, data is initially read from one cell (initial read), the electric charge of the read data is maintained temporarily as the potential on the bit line, and data of a prescribed value is written to the cell and immediately read therefrom (latter read), thereby attaining a reference potential. At this time, in order to determine the logical value of the data using the reference potential, it is necessary to set the reference potential between the potential corresponding to the logical value "0" and the potential corresponding to the logical value "1", and thus, an offset is added to the read potential from the initial read. As an example, a method is known in which an electric charge is applied to bit lines having differing lengths for the initial read and the latter read, thereby using the difference in wiring capacitance to generate the offset (Japanese Patent Application Laid-Open Publication No. H11-191295, for example).

However, the offset amount by such a method is determined by the wiring capacitance of the bit line, and thus, is affected by variances in manufacturing. As a countermeasure, a semiconductor storage device in which minute adjustments to the offset can be made after manufacturing is proposed (Japanese Patent Application Laid-Open Publication No. 2014-207032, for example) Hereinafter, Japanese Patent Application Laid-Open Publication No. 2014-207032 is referred to as "Doi". Further, in this specification, reference numbers in Doi are referred to as new reference numbers by adding 100 to each of the original reference numbers of Doi. That is, for example, the reference numbers "31" and "n1" of FIG. 5 of Doi are explained as reference numbers "131" and "n101," respectively, in this specification. Doi proposes in FIG. 5 a semiconductor storage device in which a capacitor 131 and a transistor 133 as a MOS capacitor are connected in series to a potential retention line 172 that maintains a potential corresponding to the data value read from the memory cell during the initial read, and minute adjustments are made to the capacitance (load capacitance) for retaining the electric charge. This device uses the decrease in potential BLSA in the potential retention line 172 resulting from capacitance coupling through the pair of capacitors (capacitor 131 and transistor 133) as an offset. By adjusting the precharge potential VCAP102 connected through the switch134 to a node n102 between the capacitor 131 and the transistor 133, the drop in potential BLSA can be adjusted, thereby allowing the offset to be adjusted by voltage dependence of the capacitance of the capacitor 131 and the transistor 133.

Another method for adjusting the offset after manufacturing is a method for changing the area used for the capacitor. For example, by replacing a conventional capacitor (transistor 133 of Doi) with an assembled body formed by connecting a plurality of partial capacitors in parallel and additionally connecting a switch in series to the gate electrode of each of the plurality of partial capacitors, it is possible to adjust the capacitance.

SUMMARY

In the memory device shown in FIG. 5 of Doi, unless an applied voltage to the capacitor is added to within a prescribed range (interval D101b of FIG. 8 in Doi), the desirable characteristics that "the capacitance in relation to the voltage has a positive gradient" cannot be attained. However, due to variances in manufacturing, mixing in an accurate applied voltage is difficult. Also, there are limits to the reliability of the voltage (withstand voltage) that can be applied to the capacitor, and thus, it is difficult to raise the upper limit of the offset adjustment range using only the precharge potential VCAP102.

It is possible to apply a means of switching the area of the capacitors to the capacitor 131 of Doi, but this poses the disadvantage that the total capacitance of the potential retention line 172 increases, and thus, the electric charge read from the memory cell during the initial read is distributed to the capacitance, and the electric charge that can be used by the sense amplifier is partially lost, which reduces the read margin.

On the other hand, as a method for generating an offset, if employing capacitance coupling through capacitors as in Doi and applying to the capacitor (transistor 133 of Doi) a means for switching the area of the capacitors as a means for adjusting the offset after manufacturing, it is possible to realize a self-referential method with a relatively wide offset adjustment range, and by which minute adjustment is possible. However, in such a case, there was a disadvantage that the upper limit of the offset adjustment range tended to be saturated. The reason is that if the area of the two capacitors connected in series such as the capacitor 131 and the transistor 133 in FIG. 5 of Doi were to be greatly increased in order to widen the adjustment range, the combined capacitance of the two capacitors would typically converge on the smaller capacitance among the capacitances of the two capacitors, which would limit the upper limit of the offset adjustment range.

The present invention takes into consideration the above problem, and an object thereof is to provide a non-volatile semiconductor storage device by which the upper limit of the offset adjustment range can be increased and offset adjustment can be performed with a high degree of freedom.

According to an aspect of the invention, a non-volatile semiconductor storage device includes, includes a memory cell, a first potential retention line connected to the memory cell, and being configured to retain a potential corresponding to data read from the memory cell, a second potential retention line connected to the memory cell, and being configured to retain a reference potential that is read from the memory cell in which the reference potential is written after the data is read out, and a sense amplifier having a first end and a second end respectively connected to the first potential retention line and the second potential retention line, the sense amplifier being configured to amplify a difference between the potential retained by the first potential retention line and the reference potential retained by the second potential retention line for reading out the data from the memory cell. The storage device includes a capacitor connected to the first potential retention line and a first variable capacitance circuit having a first capacitance that is adjustable, and being connected to the first potential retention line through the capacitor. An offset command signal supply circuit is configured to supply an offset command signal having an offset amount to the first variable capacitance circuit and is configured to control the offset based on the offset amount. A first switch element is connected between the first potential retention line and the capacitor and is configured to connect or disconnect the first potential retention line to the capacitor. A second switch element is connected to the second potential retention line.

According to one embodiment, the storage device includes a second variable capacitance circuit having a second capacitance that is adjustable, and the second switch element is connected between the second potential retention line and the second variable capacitance circuit, and is configured to connect or disconnect the second potential retention line to the second variable capacitance circuit.

Moreover, according to one embodiment, one end of the second switch element is connected to the second potential retention line and another end of the second switch element is connected to one of a floating potential and a ground potential. A gate of the second switch element may be connected to the ground potential. A gate of the first switch element may be connected to a control signal, other than the ground potential, to turn on and off the first switch element.

According to the non-volatile semiconductor storage device of the present invention, it is possible to increase the upper limit of the offset adjustment range and to perform offset adjustment with a high degree of freedom.

BRIEF DESCRIPTION OF THE DRAWINGS

FIG. 3 is a timing chart showing an operation of the memory device according to Embodiment 1.

FIG. 7 is a timing chart showing an operation of the memory device according to Embodiment 3.

DETAILED DESCRIPTION OF EMBODIMENTS

Figure 1:
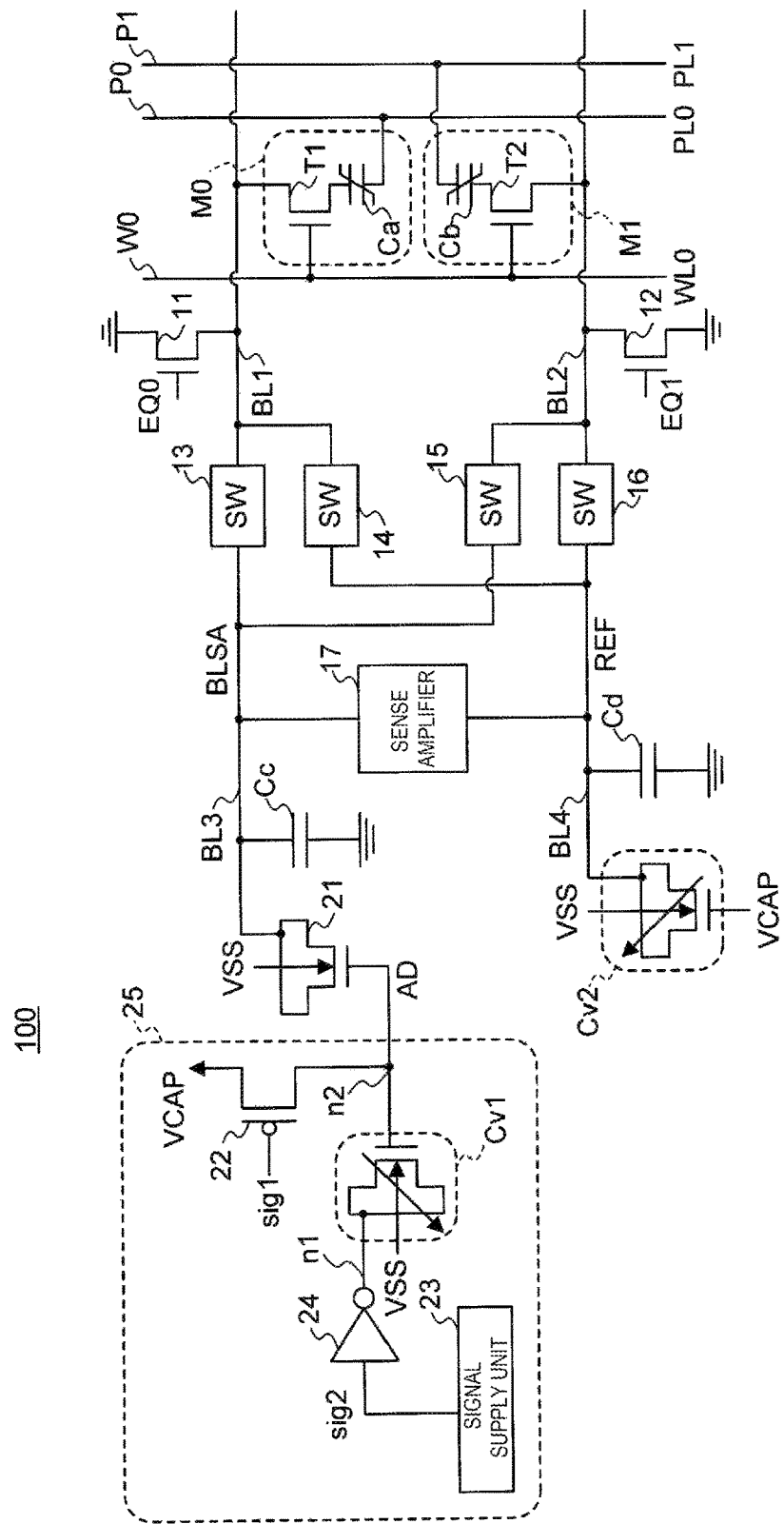
FIG. 1 is a circuit diagram showing a configuration of a memory device according to Embodiment 1.

Embodiments of the present invention will be explained below with reference to the drawings. In the description of embodiments and the affixed drawings below, parts that are substantially the same or equivalent are assigned the same reference characters.

Embodiment 1

FIG. 1 is a circuit diagram showing a configuration of a memory device 100 according to the present embodiment.

The memory device 100 includes memory cells M0 and M1, precharge transistors 11 and 12, a sense amplifier 17, a capacitor (first capacitor) 21, and variable capacitance circuits Cv1 and Cv2.

The memory cell M0 is constituted of a cell capacitor Ca and a cell transistor T1. The cell capacitor Ca is a ferroelectric capacitor, for example, and the transistor T1 is an NMOS transistor, for example. A first end of the cell capacitor Ca is connected to a plate line P0, and is supplied a signal PL0 in the plate line P0. A second end of the cell capacitor Ca is connected to the drain of the cell transistor T1. The source of the cell transistor T1 is connected to one bit line BL1 among a pair of bit lines BL1 and BL2 adjacent to each other.

The memory cell M1 is constituted of a cell capacitor Cb and a cell transistor T2. The cell capacitor Cb is a ferroelectric capacitor, for example, and the transistor T2 is an NMOS transistor, for example. A first end of the cell capacitor Cb is connected to a plate line P1, and is supplied a signal PL1 in the plate line P1. A second end of the cell capacitor Cb is connected to the drain of the cell transistor T2. The source of the transistor T2 is connected to the other bit line BL2.

The gates of the cell transistors T1 and T2 are connected to the same word line W0, and are configured to be supplied a signal WL0. In the description below, the word line W0 and the plate lines P0 and P1 are collectively referred to as a group of selection lines. The group of selection lines intersect with the bit lines BL1 and BL2. The memory cells M0 and M1 are located at such intersection points.

The precharge transistor 11 is an NMOS transistor, for example. The drain of the precharge transistor 11 is connected to the bit line BL1, and the source thereof is connected to ground potential, for example. A precharge signal EQ0 is supplied to the gate of the precharge transistor 11. The precharge transistor 11 is configured to operate as a switch that selectively connects or disconnects the bit line BL1 and the ground potential or the like according to the precharge signal EQ0.

The precharge transistor 12 is an NMOS transistor, for example. The drain of the precharge transistor 12 is connected to the bit line BL2, and the source thereof is connected to ground potential, for example. A precharge signal EQ1 is supplied to the gate of the precharge transistor 12. The precharge transistor 12 is configured to operate as a switch that selectively connects or disconnects the bit line BL2 and the ground potential or the like according to the precharge signal EQ1.

The bit line BL1 is connected to a potential retention line BL3 through a switch 13 (hereinafter referred to as "SW"). Also, the bit line BL1 is connected to a potential retention line BL4 through an SW 14. The bit line BL2 is connected to a potential retention line BL4 through an SW 16. Also, the bit line BL2 is connected to a potential retention line BL3 through an SW 15. The SWs 13 to 16 are connection switches that are configured to be turned ON/OFF according to a switch ON/OFF signal (not shown), and to selectively connect one of the bit lines BL1 and BL2 to one of the potential retention lines BL3 and BL4.

A first end (terminal) of the sense amplifier 17 is connected to the potential retention line BL3 and a second end is connected to the potential retention line BL4. The sense amplifier 17 amplifies the potential difference between that of the potential retention line BL3 and that of the potential retention line BL4. The potential of the potential retention line BL3 is maintained by a parasitic capacitance Cc. The potential of the potential retention line BL4 is maintained by a parasitic capacitance Cd.

The capacitor 21 is an NMOS transistor, for example, and functions as a MOS capacitor. In the description below, the capacitor 21 is also referred to as the "transistor 21". In the transistor 21, the source and drain are connected to each other and are connected to the potential retention line BL3. The back gate of the transistor 21 is connected to a prescribed potential such as ground potential. The gate of the transistor 21 is connected to the node n2.

The node n2 is connected to a precharge potential VCAP through the transistor 22, which functions as a switch transistor. The transistor 22 is a PMOS transistor, for example, and the drain thereof is connected to the node n2, and the source thereof is connected to the precharge potential VCAP. An ON/OFF signal sig1 is supplied to the gate of the transistor 22.

A signal supply unit 23 is configured to output an offset command signal sig2, and supply it to an inverter 24.

The input terminal of the inverter 24 is connected to the signal supply unit 23 and the output terminal of the inverter 24 is connected to the node n1. The potential of the node n1 fluctuates according to the level of the signal attained by inverting the level of the offset command signal sig2.

The variable capacitance circuit Cv1 is connected to the node n1 and the node n2. The capacitance of the variable capacitance circuit Cv1 can be adjusted by a capacitance switching signal (not shown).

Figure 2A:
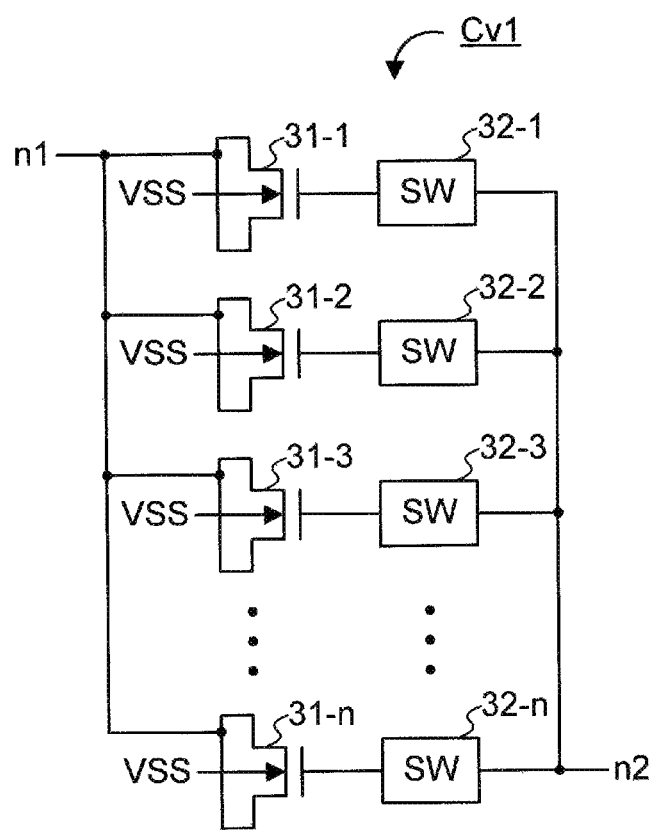
FIGS. 2A and 2B are circuit diagrams showing configurations of variable capacitance circuits.

FIG. 2A shows a configuration of a variable capacitance circuit Cv1. The variable capacitance circuit Cv1 is constituted of a plurality of MOS transistors (indicated in drawing as transistors 31-1 to 31-$n$) in which the drain and source are connected to each other and to the node n1, and a plurality of switch elements (indicated in drawing as SW 32-1 to 32-$n$) connected between the gate electrode of each MOS transistor and the node n2. The transistors 31-1 to 31-$n$ may correspond to second capacitors, and switch elements SW 32-1 to 32-$n$ may correspond to changeover switches. These are connected in parallel between the nodes n1 and n2 with each pair of a MOS transistor and a switch element connected in series as an individual unit.

Each of the transistors 31-1 to 31-$n$ is an NMOS transistor, for example, and functions as a MOS capacitor. Also, each of the SWs 32-1 to 32-$n$ is constituted of at least one of a CMOS switch, a PMOS switch, a metal fuse, a polyfuse, or the like, for example.

When turning on the power source of the memory device 100, information indicating the signal level ("H" or "L") of the capacitance switching signal for switching the SWs 32-1 to 32-$n$ ON/OFF is read from a storage means that is not shown (memory cell, fuse, etc., for example) and supplied to the SWs 32-1 to 32-$n$. As a result, switching of the capacitance of the variable capacitance circuit Cv1 is performed before the start of the data reading operation.

The transistor 22, the signal supply unit 23, the inverter 24, and the variable capacitance circuit Cv1 constitute an offset command signal supply unit 25 for generating an offset (voltage) to the potential retention line BL3 through the capacitor 21.

The variable capacitance circuit Cv2 is connected to the potential retention line BL4. Like the variable capacitance circuit Cv1, the capacitance of the variable capacitance circuit Cv2 can be adjusted according to a capacitance switching signal (not shown), and the total capacitance of the potential retention line BL4 (total capacitance of bit line) is changed according to the capacitance of the variable capacitance circuit Cv2.

Figure 2B:
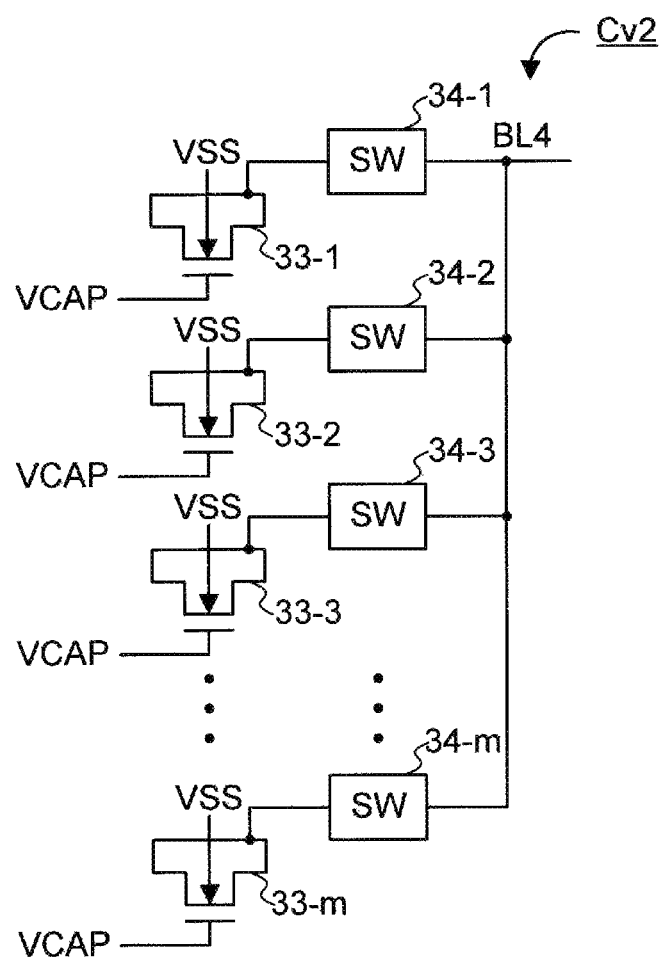

FIG. 2B shows a configuration of a variable capacitance circuit Cv2. The variable capacitance circuit Cv2 is constituted of a plurality of MOS transistors (indicated in drawing as transistors 33-1 to 33-$m$) in which the drain and source are connected to each other and to which the precharge potential VCAP is supplied, and a plurality of switch elements (indicated in drawing as SW 34-1 to 34-$m$) connected between the source and drain of each MOS transistor and the potential retention line BL4. These are connected in parallel with each pair of a MOS transistor and a switch element connected in series as an individual unit.

Each of the transistors 33-1 to 33-$m$ is an NMOS transistor, for example, and functions as a MOS capacitor. Also, each of the SWs 34-1 to 34-$m$ is constituted of at least one of a CMOS switch, a PMOS switch, a metal fuse, a polyfuse, or the like, for example.

When turning on the power source of the memory device 100, information indicating the signal level ("H" or "L") of the capacitance switching signal for switching the SWs 34-1 to 34-$m$ ON/OFF is read from a storage means that is not shown (memory cell, fuse, etc., for example) and supplied to the SWs 34-1 to 34-$m$. As a result, switching of the capacitance of the variable capacitance circuit Cv2 is performed before the start of the data reading operation.

The variable capacitance circuits Cv1 and Cv2 differ in terms of the upper limit of the variable capacitance (maximum capacitance). The variable capacitance circuit Cv2 has a maximum capacitance of approximately the same amount as the capacitance of the capacitor 21, and the variable capacitance circuit Cv1 has a maximum capacitance of much greater than the capacitance of the capacitor 21.

Next, a data reading operation of the memory device 100 of the present embodiment will be described with reference to the timing chart of FIG. 3. In the description below, an example is given in which the capacitance of the variable capacitance circuit Cv2 is adjusted so as to be less than the capacitance of the capacitor 21. Also, in FIG. 3, B0 indicates the potential BLSA for a case in which the data value read in during the initial read is "0", and B1 indicates the potential BLSA for a case in which the data value read in during the initial read is "1". Also, an example is given here of a case in which reading is performed by selecting the memory cell M0.

The memory device 100 starts the data reading operation with an initial state in which the SW 13 is ON and the SW 14 is OFF.

First, by setting the signal level of the memory selection signal WL0 to "H", the memory cell M0 is selected.

Next, at time T0, the level of the signal PL0 is set to "H", and the data stored in the memory cell M0 is read. Below, this reading operation is referred to as the "initial read".

The potential BLSA of the potential retention line BL3 is set according to the data value read from the memory cell M0. The potential BLSA rises from a time T0 to a time T1 as the parasitic capacitance Cc is charged.

Next, at the time T1, the signal level of the switch ON/OFF signal (referred to as the SW 1 ON/OFF signal) supplied to the SW 13 is set to "L", and the SW 13 is turned OFF. Even after the SW 13 is turned OFF, the potential BLSA is maintained by the parasitic capacitance Cc.

Next, at the time T2, the signal level of the precharge signal EQ0 is set to "H", and the precharge transistor 11 is turned ON. As a result, the potential of the bit line BL1 is set to the ground potential VSS, and a logical value of "0" is written to the memory cell M0. After writing of the logical value "0", the signal level of the signal PL0 is temporarily lowered to "L".

At the time T2, the signal level of the ON/OFF signal sig1 is changed from the ground potential VSS to the precharge potential VCAP, and the transistor 22 is turned OFF. As a result, the potential of the node n2 is changed to a state at which the potential can change from being fixed to the precharge potential VCAP.

Next, at the time T3, the signal level of the offset command signal sig2 is changed from the ground potential VSS to the potential VDD. As a result, the potential of the node n1 connected to the output of the inverter 24 is changed from the potential VDD to the ground potential VSS.

A potential AD of the node n2 is reduced by "a" from the precharge potential VCAP, and thus, becomes VCAP−α. Where the capacitance of the variable capacitance circuit Cv1 is C1, the capacitance of the capacitor 21 is C2, and the parasitic capacitance Cc is C3, "a" is determined by the following formula.

$$\alpha = C1 \times (C1+C2) \times VDD/(C1 \times C2 + C2 \times C3 + C3 \times C1)$$

Also, the potential BLSA is reduced by "β". "β" is determined by the following formula.

$$\beta = C1 \times C2 \times VDD/(C1 \times C2 + C2 \times C3 + C3 \times C1)$$

The potential BLSA for when the data value read in during the initial read is "1" (indicated in the drawing as potential B1) is higher than the potential BLSA for when the data value is "0" (indicated in FIG. 3 as potential B0).

Next, at the time T4, the signal level of the switch ON/OFF signal (referred to as the SW 2 ON/OFF signal) supplied to the SW 14 is set to "H", and the SW 14 is turned ON. Also, the signal level of the signal PL0 is temporarily lowered to "L" at any point from when the logical value of "0" is written at the time T2 to the time T4 (after the time T3 in FIG. 3, for example), and the signal level of the signal PL0 is raised again to "H" at the time T4. As a result, a data value of "0" is read at the potential retention line BL4. Below, this reading operation is referred to as the "latter read".

The potential REF of the potential retention line BL4 (indicated with broken line in FIG. 3) is set according to the data value read from the memory cell M0. The potential REF is positioned between the potential B0 and the potential B1 and maintained by the parasitic capacitance Cd.

Next, at the time T5, the signal level of the SW 2 ON/OFF signal is set to "L", and the SW 14 is turned OFF. Even after the SW 14 is turned OFF, the potential REF is maintained by the parasitic capacitance Cd.

Next, during the time T6, the sense amplifier 17 amplifies the potential difference between the potential BLSA and the potential REF. As a result, if the initially read data value is "0", the potential B0 drops, and if the initial read data value is "1", the potential B1 rises.

If the data value read during the initial read is "0", then the read charge from the memory cell M0 introduced to the potential retention line BL3 during the initial read is equal to the read charge from the memory cell M0 introduced to the potential retention line BL4 during the latter read. Thus, if the total capacitance were equal between the potential retention line BL3 and the potential retention line BL4, the potential BLSA of the potential retention line BL3 at the time T2 to T3 (that is, the potential B0) would be substantially equal to the potential REF of the potential retention line BL4 at the time T6.

However, the memory device 100 of the present embodiment is configured such that the capacitance of the variable capacitance circuit Cv2 can be adjusted. Thus, by adjusting the capacitance of the variable capacitance circuit Cv2 such that the load capacitance of the potential retention line BL4 is less than the capacitance of the potential retention line BL3, it is possible to generate an offset.

Specifically, if the capacitance of the variable capacitance circuit Cv2 is adjusted to be less than the capacitance of the capacitor 21, then the potential REF generated in the potential retention line BL4 during the time T6 when the latter read is performed is higher than the potential BLSA (B0) generated in the potential retention line BL3 during the time T2 to T3 when the initial read is performed.

In this manner, in the memory device 100 of the present embodiment, it is possible to lower the potential BLSA of the potential retention line BL3 during the time T3 and to set the potential of the potential retention line BL4 during the latter read to be relatively high as a result of the operation of the offset command signal supply unit 25. Thus, it is possible to raise the upper limit of the offset adjustment range.

If, unlike the memory device 100 of the present embodiment, a normal capacitor, such as the capacitor 140 of Doi, for setting the total capacitance of the potential retention line BL3 equal to the total capacitance of the potential retention line BL4 were connected instead of the variable capacitance circuit Cv2, then if the capacitance of the capacitor 21 directly connected to the potential retention line BL3 is increased, for example, in order to raise the upper limit of the offset adjustment range, then the relative effect of the read charge from the memory cell M0 or M1 is reduced, which reduces the read margin of the sense amplifier 17.

By contrast, in the memory device 100 of the present embodiment, by adjusting the capacitance of the variable capacitance circuit Cv2, it is possible to reduce the load capacitance of the potential retention line BL4, which is the bit line on the reference potential side (potential REF side), and thus, it is possible to prevent a reduction in read margin.

Figure 5:
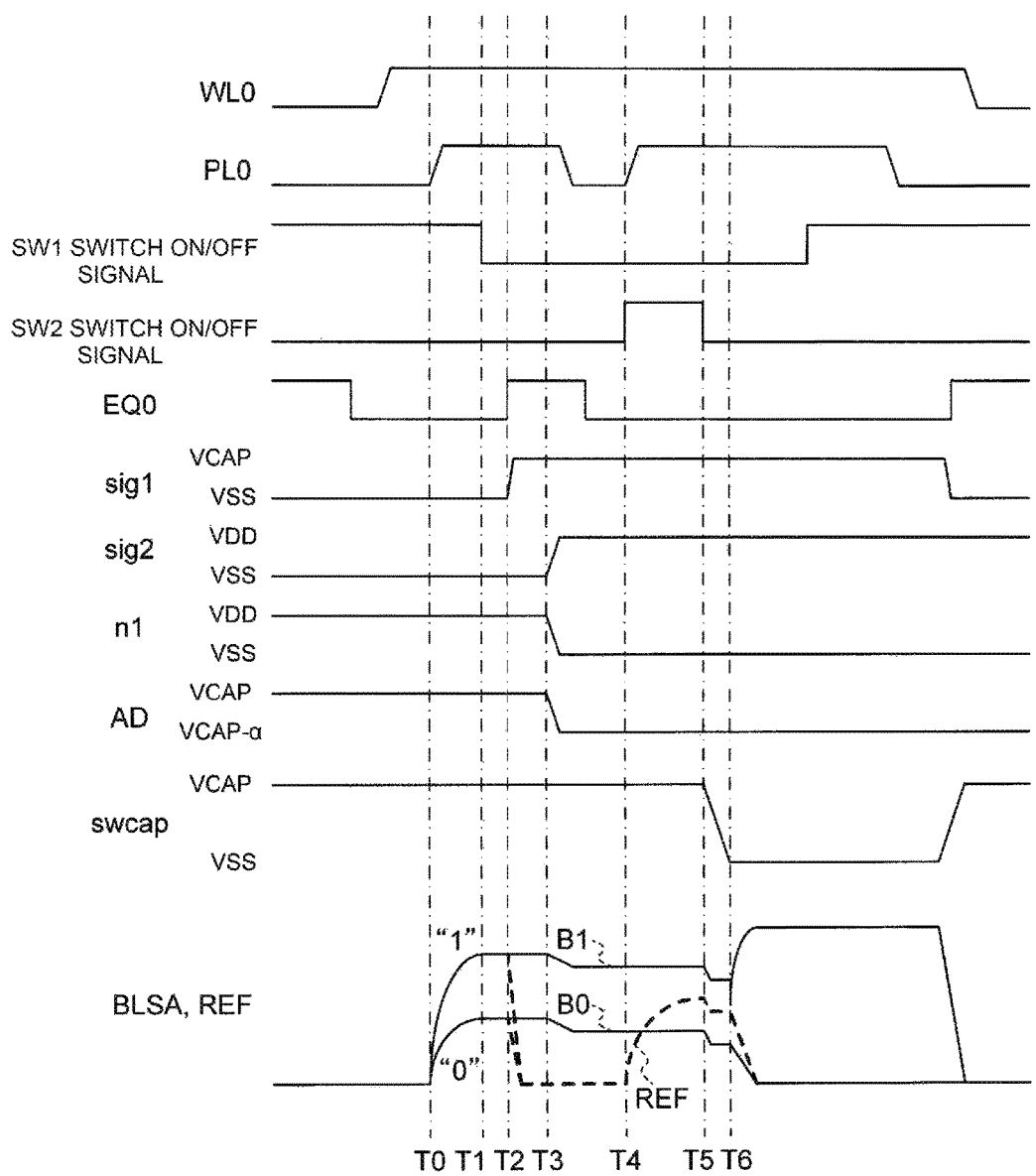
FIG. 5 is a timing chart showing an operation of the memory device according to Embodiment 2.

Also, in a configuration such as that shown in FIG. 5 of Doi, if the capacitance of a capacitor that is connected to the capacitor 21 but not directly connected to the bit line BL3 (capacitor connected to a position corresponding to the variable capacitance circuit Cv1 of the present embodiment) is increased in order to raise the upper limit of the offset adjustment range, then the combined capacitance of the two capacitors trends towards saturation, which means increasing the upper limit of the offset adjustment range would be difficult.

By contrast, in the memory device 100 of the present embodiment, it is possible to adjust the capacitance of the variable capacitance circuit Cv2 while preventing the capacitance of the variable capacitance circuit Cv1 from increasing excessively relative to the capacitance of the capacitor 21, and thus, it is possible to avoid the problem in which the combined capacitance of the variable capacitance circuit Cv1 and the capacitor 21 trends towards saturation when adjusting the capacitance of the capacitors in order to increase the upper limit of the offset adjustment range.

Also, the capacitor connected to the position corresponding to the variable capacitance circuit Cv1 of the present embodiment needs to indirectly decrease the potential BLSA of the potential retention line BL3 through the capacitor 21, and thus, the capacitance and the area taken up are typically large. However, in the memory device 100 of the present embodiment, it is possible to adjust the capacitance of the variable capacitance circuit Cv2, and thus, even if the upper limit of the capacitance that can be set for the variable capacitance circuit Cv1 were set relatively low, it is possible to achieve an equivalent offset adjustment range. Thus, it is possible to reduce the total area taken up by the variable capacitance circuit.

Also, in general, semiconductor memories have a lot of memory cells, and thus, there is a need to lay out elements according to the width of the memory cells, and in order to connect the variable capacitance circuit Cv2 and the capacitor 21 of FIG. 1, the bit line (potential retention line) on the sense amplifier side needs to be long, which increases the parasitic capacitance. However, according to the memory device 100 of the present embodiment, offset can be generated by the potential retention line BL3 and the potential retention line BL4 in conjunction with each other, and thus, it is possible to reduce the total area of the capacitors in relation to a given offset value. Therefore, it is possible to lay out the elements more easily than in the configuration of Doi, as well as reducing the relative size of the potential retention lines BL3 and BL4 and reducing the parasitic capacitance. Also, the offset generation efficiency and area efficiency are improved.

Embodiment 2

Figure 4:
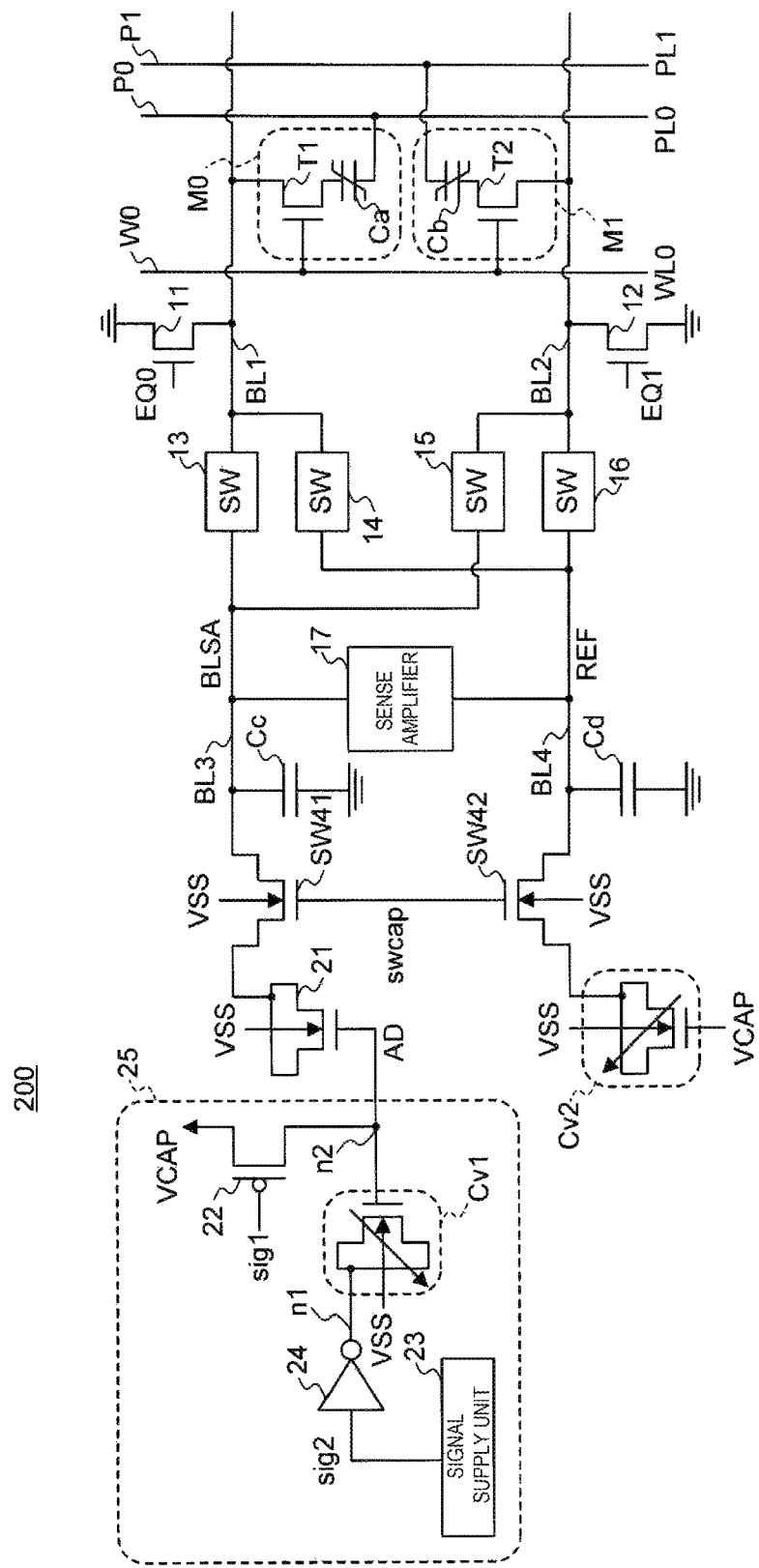
FIG. 4 is a circuit diagram showing a configuration of a memory device according to Embodiment 2.

FIG. 4 is a circuit diagram showing a configuration of a memory device 200 according to Embodiment 2. The memory device 200 differs from the memory device 100 of Embodiment 1 by having an SW 41 interposed between the potential retention line BL3 and the capacitor 21, and an SW 42 interposed between the potential retention line BL4 and the variable capacitance circuit Cv2.

The SW 41 is an NMOS transistor, for example, and the source and drain thereof are connected to the capacitor 21 and the potential retention line BL3, respectively. Similarly, the SW 42 is an NMOS transistor, for example, and the source and drain thereof are connected to the variable capacitance circuit Cv2 and the potential retention line BL4, respectively. The gate electrodes of the SWs 41 and 42 are connected to each other and are configured to receive a capacitor activation signal swcap. The SWs 41 and 42 are formed to the same size, for example.

The SWs 41 and 42 are provided in order to prevent imbalance in the load capacitances of the two input terminals of the sense amplifier 17. At the instant when amplification by the sense amplifier 17 starts (activates), if there is even a slight imbalance between the load capacitances of the two input terminals, then the sensing margin can worsen. As a countermeasure, even if the capacitance of the variable capacitance circuit Cv2 were set to an extreme, for example, worsening of the sensing margin resulting from imbalance in the load capacitance values, is prevented, and thus, when the sense amplifier is activated and thereafter, the SWs 41 and 42 are turned OFF.

Next, a data reading operation of the memory device 200 of the present embodiment will be described with reference to the timing chart of FIG. 5. The timing chart of FIG. 5 differs from the timing chart of FIG. 3 of Embodiment 1 in that it includes the capacitor activation signal swcap.

The "H" level of the capacitor activation signal swcap is set to the precharge potential VCAP and the "L" level of the capacitor activation signal swcap is set to the ground potential VSS, for example.

At the time T5, the capacitor activation signal swcap transitions from the "H" level to the "L" level. As a result, at least after the time T6, the SWs 41 and 42 are turned OFF.

The time T6 corresponds to the activation timing of the sense amplifier 17. By the SWs 41 and 42 being turned OFF, after the time T6, the load capacitances of the two input terminals of the sense amplifier 17 are in a balanced state. Thus, worsening of the sensing margin of the sense amplifier 17 is prevented.

In the timing chart of FIG. 5, the potential BLSA and the potential REF lowers slightly in synchronization with the time T5. This is because as a result of the fall of the capacitor activation signal swcap, capacitance coupling between the gate and drain of the NMOS transistors constituting the SWs 41 and 42 causes noise to be generated in the potential retention lines BL3 and BL4. However, the SWs 41 and 42 are the same size and laid out in a regular manner, and thus, the coupling noise occurring in the potential BLSA and the coupling noise occurring in the potential REF can be considered equal. Thus, no worsening of the sensing margin resulting from coupling noise occurs.

In this manner, in the memory device 200 of the present embodiment, the load capacitances on the two input terminals of the sense amplifier are controlled to be equal when the sense amplifier is being activated (when amplification is started). Therefore, even if the capacitance of the variable capacitance circuit Cv2 were to be set extremely low, for example, it is possible to prevent a worsening of the sensing margin.

The memory device 200 of the present embodiment may be used to perform 2T2C data reading. In such a case, by controlling the SWs 41 and 42 so as to always be OFF, the load capacitances of the potential retention lines BL3 and BL4 become low, and thus, it is possible to not only prevent a worsening of the sensing margin but also to increase the speed of reading and writing from/to memory cells and to achieve a relative reduction in operating power.

Also, the timing at which the capacitor activation signal swcap is lowered may be immediately before the time T6, which is the activation timing for the sense amplifier 17. Thus, while in FIG. 5, the capacitor activation signal swcap falls at the same time that the SW 2 ON/OFF signal falls, but the falling of such signals need not necessarily happen simultaneously. For example, if the capacitor activation signal swcap falls before the time T5, the load capacitance of the potential retention line BL4 becomes small in the middle of the latter read period, and thus, the effect of raising the potential REF can be achieved to an even greater degree than shown in the timing chart of FIG. 5. That is, by setting an earlier timing for the fall of the capacitor activation signal swcap, it is possible to further raise the upper limit of the offset adjustment range.

Embodiment 3

Figure 6:
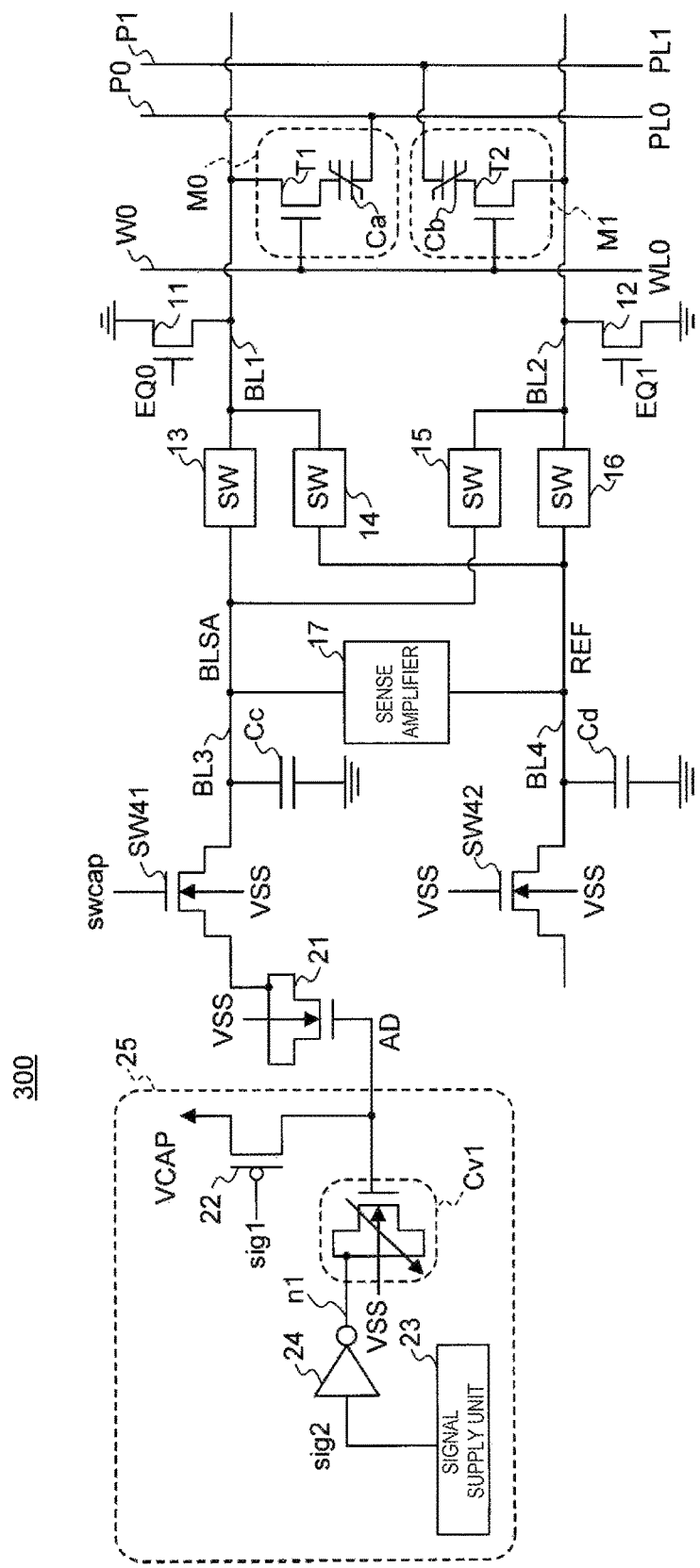
FIG. 6 is a circuit diagram showing a configuration of a memory device according to Embodiment 3.

FIG. 6 is a circuit diagram showing a configuration of a memory device 300 according to Embodiment 3. The memory device 300 differs from the memory device 200 of Embodiment 2 (FIG. 4) in that the memory device 300 does not have the variable capacitance circuit Cv2, and the ground potential VSS is supplied to the gate electrode of the SW 42 instead of the capacitor activation signal swcap. The source terminal of the SW 42 may be set at floating potential or at the ground potential VSS.

FIG. 7 is a timing chart showing a data reading operation of the memory device 300 according to the present embodiment.

The gate electrode is connected to the ground potential VSS, and thus, the SW 42 is always OFF. Thus, the load capacitance of the potential retention line BL4 when performing the latter read is less than in Embodiment 2. Therefore, the potential REF when performing the latter read is higher than in Embodiment 2.

Also, the coupling noise during the transition of the capacitor activation signal swcap affects only the potential retention line BL3 and not the potential retention line BL4. Thus, unlike Embodiment 2, the potential REF does not fall when the capacitor activation signal swcap falls.

In this manner, in the memory device 300 of the present embodiment, the capacitance of the potential retention line BL4 is lowered as much as possible, and only noise in which the potential of the potential retention line BL3 decreases occurs, and thus, the offset generated during the latter read is increased.

Also, in the memory device 300 of the present embodiment as well, the load capacitances of the potential retention lines BL3 and BL4 are equal at the time T6, and thus, the sensing margin does not worsen. Even in such a case, it is possible to adjust the offset at the time T3 using the variable capacitance circuit Cv1, and thus, it is possible to set the reading margin for "0" and the reading margin for "1" at the time T6 to be equal.

As described above, according to the present invention, it is possible to raise the upper limit of the offset adjustment range by increasing the potential at the potential retention line (BL4) where the reference potential is introduced, among the pair of potential retention lines (BL3 and BL4).

The present invention is not limited to the embodiments above. In Embodiment 3, for example, a case was described in which the variable capacitance circuit Cv2 is not present and the ground potential VSS was supplied to the gate electrode of the SW 42. However, a configuration may be adopted in the memory device 100 of Embodiment 1 and the memory device 200 of Embodiment 2, for example, in which the variable capacitance circuit Cv2 is simply omitted. Even in such a case, offset adjustment can be performed using the variable capacitance circuit Cv1. By this configuration, it is possible to reduce the area by an amount corresponding to the area that would have been taken up by the variable capacitance circuit Cv2, and thus, it is possible to reduce the cost of the memory device.

In Embodiments 1 and 2, the gate electrode of the variable capacitance circuit Cv2 is set to the precharge potential VCAP, but may be set to a potential differing from the precharge potential VCAP (a potential higher than VCAP).

Also, in the above embodiments, examples were described in which the capacitor 21 and the variable capacitance circuits Cv1 and Cv2 are constituted of capacitors including MOS capacitors (MOS transistors), but the type of capacitor is not limited thereto, and may be a MIM (metal-insulator-metal) capacitor, a PiP (poly-insulator-poly) capacitor, or the like.

In Embodiment 2, an example was described in which the SWs 41 and 42 are NMOS transistors, but the present embodiment is not limited thereto and the SWs may instead be constituted of CMOS switches or the like.

Further, as explained above, there are two types of memory circuit; one is one transistor and one capacitor (1T1C) and the other is two transistors and two capacitors (2T2C). 2T2C data reading may be performed using the memory device 200 of Embodiment 2 or the memory device 300 of Embodiment 3. If, for example, the memory device 200 of the present embodiment were configured as a memory device that can switch between 1T1C mode and 2T2C mode, then in 2T2C mode, no offset needs to be generated, and thus, the capacitor activation signal swcap would be controlled so as to always be at the "L" level. As a result, the load capacitances of the potential retention lines BL3 and BL4 become low, and thus, it is possible to not only prevent a worsening of the sensing margin but also to increase the speed of reading and writing to memory cells and to achieve a relative reduction in operating power.

Also, in the embodiments above, an example was described in which the capacitor activation signal swcap is at the precharge potential VCAP when at the "H" level, but the present invention is not limited thereto, and any configuration may be adopted as long as a range is adopted in which the potentials BLSA and REF are greater than the maximum potential reached during normal operation by at least a threshold Vth of the NMOS transistors constituting the SWs 41 and 42 while not exceeding the withstand voltage of the NMOS transistors.

What is claimed is:

1. A non-volatile semiconductor storage device, comprising:
   a memory cell;
   a first potential retention line connected to the memory cell, and being configured to retain a potential corresponding to data read from the memory cell;
   a second potential retention line connected to the memory cell, and being configured to retain a reference potential that is read from the memory cell, the reference potential being written after the data is read out;
   a sense amplifier having a first end and a second end respectively connected to the first potential retention line and the second potential retention line, the sense amplifier being configured to amplify a difference between the potential retained by the first potential retention line and the reference potential retained by the second potential retention line for reading out the data from the memory cell;
   a capacitor connected to the first potential retention line;
   a first variable capacitance circuit having a first capacitance that is adjustable, and being connected to the first potential retention line through the capacitor;
   an offset command signal supply circuit configured to supply an offset command signal having an offset amount to the first variable capacitance circuit, and being configured to control the offset based on the offset amount;
   a first switch element connected between the first potential retention line and the capacitor, and being configured to connect or disconnect the first potential retention line to the capacitor; and
   a second switch element connected to the second potential retention line.

2. The non-volatile semiconductor storage device according to claim 1 further comprising:
   a second variable capacitance circuit having a second capacitance that is adjustable, wherein the second switch element is connected between the second potential retention line and the second variable capacitance circuit, and is configured to connect or disconnect the second potential retention line to the second variable capacitance circuit.

3. The non-volatile semiconductor storage device according to claim 1, wherein
one end of the second switch element is connected to the second potential retention line, and
another end of the second switch element is connected to one of a floating potential and a ground potential.

4. The non-volatile semiconductor storage device according to claim 3, wherein a gate of the second switch element is connected to the ground potential.

5. The non-volatile semiconductor storage device according to claim 1, wherein a gate of the first switch element is connected to a control signal, other than the ground potential, to turn on and off the first switch element.

6. The non-volatile semiconductor storage device according to claim 1, wherein each of the first and second switch elements is controlled by a same switch control signal to turn on and off each of the first and second switch elements.

* * * * *